US010623212B2

(12) United States Patent
Singer et al.

(10) Patent No.: US 10,623,212 B2
(45) Date of Patent: Apr. 14, 2020

(54) SPACE-TIME OVERSAMPLING AND ERROR SHAPING FOR COARSELY QUANTIZED ARRAYS

(71) Applicant: The Board of Trustees of the University of Illinois, Urbana, IL (US)

(72) Inventors: Andrew Carl Singer, Mahomet, IL (US); Ryan Michael Corey, Glen Ellyn, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 16/197,875

(22) Filed: Nov. 21, 2018

(65) Prior Publication Data

US 2019/0238373 A1 Aug. 1, 2019

Related U.S. Application Data

(60) Provisional application No. 62/622,430, filed on Jan. 26, 2018.

(51) Int. Cl.
*H04L 25/03* (2006.01)
*H04L 1/00* (2006.01)
*H03M 3/00* (2006.01)
*H04B 7/0413* (2017.01)

(52) U.S. Cl.
CPC ...... *H04L 25/03828* (2013.01); *H03M 3/502* (2013.01); *H04L 1/0014* (2013.01); *H04B 7/0413* (2013.01)

(58) Field of Classification Search
CPC ............ H04L 25/03828; H04L 1/0014; H04B 7/0413

USPC ......................................................... 375/267
See application file for complete search history.

(56) References Cited

U.S. PATENT DOCUMENTS

| 8,068,554 | B2* | 11/2011 | Lin | H04B 7/0417 |
| | | | | 375/267 |
| 2007/0087756 | A1* | 4/2007 | Hoffberg | G06Q 10/0631 |
| | | | | 455/450 |
| 2009/0135033 | A1* | 5/2009 | Huppertz | H03M 3/384 |
| | | | | 341/118 |
| 2011/0140942 | A1* | 6/2011 | Pagnanelli | H03M 3/50 |
| | | | | 341/144 |

(Continued)

OTHER PUBLICATIONS

Hälsig, et al., "Spatial Oversampling in LOS MIMO Systems with 1-Bit Quantization at the Receiver," Institute for Communications Engineering, Universität der Bundeswehr München, Germany, 6 pages, Feb. 10, 2017.

(Continued)

*Primary Examiner* — Hirdepal Singh
(74) *Attorney, Agent, or Firm* — Sunstein LLP

(57) ABSTRACT

Methods and apparatus for shaping and filtering quantization errors conjointly in space and time to produce a higher-precision output in a spatially and temporally oversampled array. A space-time error-shaping array system has an array of sensors, each sensor producing a temporal signal comprising quantized waveforms. A multi-input multiple-output (MIMO) discrete-time filter structure with multiple inputs, each coupled to a sensor of the array of sensors, shapes quantization errors of the array of sensors on the basis of temporal aspects of the quantized waveforms conjointly with spatial aspects of the quantized waveforms.

18 Claims, 10 Drawing Sheets

(56) References Cited

U.S. PATENT DOCUMENTS

2013/0322276 A1* 12/2013 Pelletier .............. H04W 72/085
                                                          370/252
2019/0132030 A1*  5/2019 Erez ..................... H04B 7/0891
2019/0149163 A1*  5/2019 Bohannon ............ H03M 3/322
                                                          345/174

OTHER PUBLICATIONS

Corey, et al., "Spatial Sigma-Delta Signal Acquisition for Wideband Beamforming Arrays," WSA 2016; $20^{th}$ International ITG Workshop on Smart Antennas, Mar. 9, 2016.
Yilmaz, "Coarse quantization of highly redundant time-frequency representations of square-integrable functions," Applied and Computational Harmonic Analysis, vol. 14, pp. 107-132, Mar. 7, 2003.
Schreier, et al., "Understanding Delta-Sigma Data Converters," IEEE Press, A John Wiley & Sons, Inc. Publication, 455 pages, Wiley (2005).
Geerts, et al., "Design of Multi-bit Delta-Sigma A/D Converters," 225 pages, Springer (2006).
Yeang, et al., "Dense transmit and receive phased arrays," Proc. of the IEEE Int. Symp. on Phased Arrays pp. 934-939, (2004).
Scholnik, et al., "Spacio-temporal delta-sigma modulation for shared wideband transmit arrays," Proc. IEEE Radar Conf., pp. 85-90 (2004).
Barac, et al., "Spatial sigma-delta modulation in a massive MIMO cellular system," Master's thesis, Chalmers University of Technology and the University of Gothenburg, 68 pages (2016).
Van Trees, "Optimum Array Processing," Chapter 6, pp. 428-709, Wiley (2002).

* cited by examiner

Fig. 4A
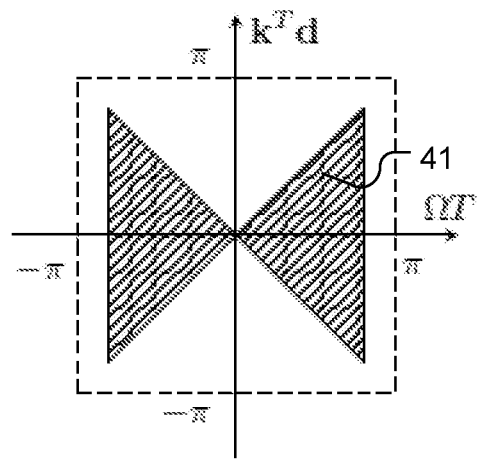
(a) Wideband
Fig. 4C
Fig. 4B
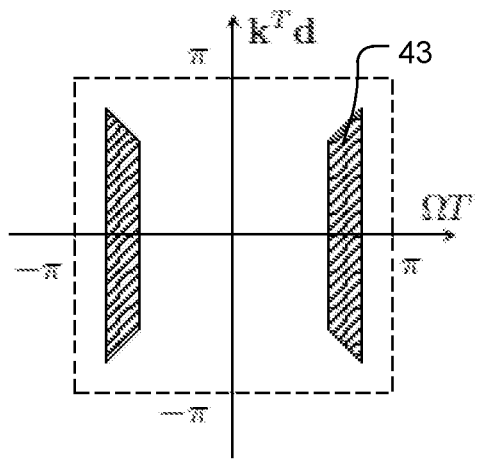
(b) Passband
Fig. 4D
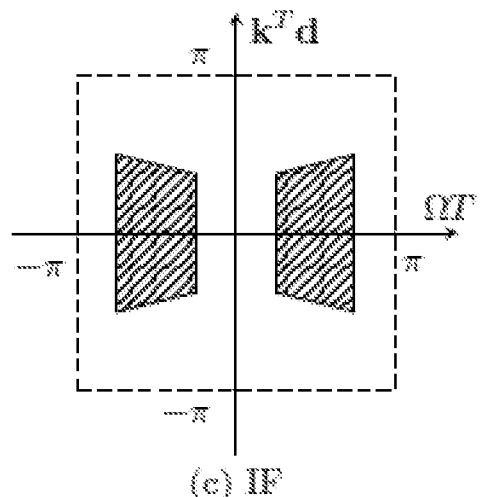
(c) IF
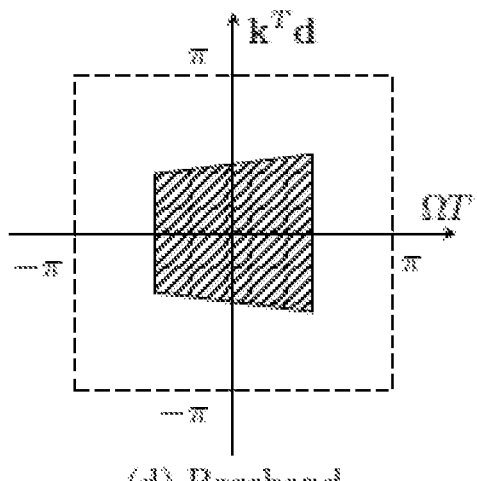
(d) Baseband (a) First-order spatial highpass (b) Fourth-order spatial bandstop (c) First-order space/first-order time highpass

US 10,623,212 B2

SPACE-TIME OVERSAMPLING AND ERROR SHAPING FOR COARSELY QUANTIZED ARRAYS

The present application claims the priority of U.S. Provisional Application Ser. No. 62/622,430, filed Jan. 26, 2018, and incorporated by reference herein.

This invention was made with government support under DGE-1144245 awarded by the National Science Foundation and HR0011-13-3-0002 awarded by the U.S. Department of Defense. The government has certain rights in the invention.

TECHNICAL FIELD OF THE INVENTION

The present invention pertains to apparatus and methods for analog-to-digital conversion, and, more particularly, for analog-to-digital conversion of signals from coarsely quantized arrays on the basis of error shaping in both space and time.

BACKGROUND OF THE INVENTION

One of the most powerful ideas in array processing is the duality between discrete-time signal processing and array signal processing: whereas discrete-time systems sample signals in time, arrays sample signals in space. Discrete-time frequency is analogous to wavenumber, which depends on direction of arrival; spatially selective processing, such as beamforming, is analogous to discrete-time filtering; and the Fourier transform can be used to perform spatial analysis. The reader is referred to Corey et al., *Spatial Sigma-Delta Signal Acquisition for Wideband Beamforming Arrays*, Proc. of the 20th International ITG Workshop, pp. 1-7 (2016) (hereinafter, "Corey 2016"), incorporated herein by reference, for background information.

Error shaping as a discrete-time signal processing method has rarely been applied to array processing The term "error shaping" is used herein, and in any appended claims, instead of the more popular "noise shaping," to distinguish quantization errors from other noise sources, such as interfering signals and circuit noise. Error shaping may be employed to reduce quantization error in systems with coarse or even single-bit quantization. A delta-sigma analog-to-digital converter (ADC), described by Schreier et al., *Understanding Delta-Sigma Data Converters*, Wiley (2005) (hereinafter, "Schreier 2005") and by Geerts et al., *Design of Multi-bit Delta-Sigma A/D Converters*, Springer (2006) (hereinafter, "Geerts 2006"), is considered with reference to FIG. 1A, where it is designated generally by numeral 11. Both of the foregoing books are incorporated herein by reference.

Delta-sigma analog-to-digital converter 11 uses analog feedback to shape quantization errors to higher frequencies. Referring to FIG. 1B, if the input signal in a signal band 13 is bandlimited in frequency and is oversampled in time, then most of the energy in the shaped error signal 15 is concentrated at high frequencies that do not contain input signal information. The output of the error-shaping modulator can be lowpass filtered to remove most of the quantization error and then downsampled to the Nyquist rate.

The same principle can be applied to array design: by oversampling in space and propagating error signals from one sensor to the next, an array can use low-precision quantizers to produce a high-precision digital output. As a motivating example for spatial error shaping, FIG. 2 shows a beamforming array designated generally by numeral 21 that is the spatial equivalent of the first-order sigma-delta ADC in FIG. 1. Quantization errors propagate from one array channel to the next and are thereby shaped to higher wavenumbers. If the array is oversampled in space, that is, if the element spacing is smaller than one half wavelength, then the quantization errors will be shaped outside the wavenumber range that propagating waves can occupy. In this example, a beamformer plays the role of the lowpass filter, removing high-wavenumber components.

Because they use fewer comparator circuits, error-shaping ADCs require much less area and power than architectures with high-resolution quantizers and are widely used in low-speed applications in which oversampling is feasible. While oversampling and error-shaping ADCs are well studied and spatial error shaping is widely used in image processing techniques such as Floyd-Steinberg dithering, there has been comparatively little work on spatial oversampling and error shaping in the array processing literature. It was reported by Halsig et al., *Spatial oversampling in LOS MIMO systems with 1-bit quantization at the receiver*, Int. ITG Conf. on Systems, Communication and Coding, pp. 1-6 (2017), incorporated herein by reference, that, even without error shaping, spatial oversampling can compensate for quantization errors in coarsely quantized communication receivers. In Yeang et al., *Dense transmit and receive phased arrays*, Proc. of the IEEE Int. Symp. on Phased Arrays pp. 934-39, (2004) and related papers, spatial error shaping is used to quantize phase shift values in a narrowband phased array. In Scholnik et al., *Spacio-temporal delta-sigma modulation for shared wideband transmit arrays*, Proc. IEEE Radar Conf., pp. 85-90 (2004), for example, the authors apply digital space-time error shaping to the signals fed into a transmit array with coarse digital-to-analog converters.

The idea of applying error shaping directly to the received signals in a sensor array was proposed independently in Corey 2016 and in Barac et al., *Spatial sigma-delta modulation in a massive MIMO cellular system*, Master's thesis, Chalmers University of Technology and the University of Gothenburg (2016) (hereinafter, "Barac 2016"), incorporated herein by reference. Corey 2016 analyzed the performance of space-time error shaping for wideband signals, such as audio, while Barac 2016 focused on narrowband multiple-input multiple-output communication systems. Both works were restricted to signals sampled at the Nyquist rate, without mixing, and to simple delay-and-sum beamformers.

SUMMARY OF CERTAIN EMBODIMENTS OF THE INVENTION

In accordance with preferred embodiments of the present invention, a space-time error-shaping array system is provided, having:
  a. an array of sensors, each sensor producing a temporal signal comprising quantized waveforms; and
  b. a multi-input multiple-output (MIMO) discrete-time filter structure having a plurality of inputs and a plurality of outputs, each input coupled to a sensor of the array of sensors, for shaping quantization errors of the array of sensors on the basis of temporal aspects of the quantized waveforms conjointly with spatial aspects of the quantized waveforms.

In accordance with alternate embodiments, the space-time error-shaping array system may also have a digital multi-channel processor for receiving output signals derived from the plurality of outputs of the MIMO discrete-time filter structure, and for processing the output signals using a statistical model of shaped quantization errors associated with the quantized waveforms.

In other embodiments of the invention, a space-time error-shaping array system is provided that has a. an array of sensors, each sensor producing a temporal signal of quantized waveforms; and
   b. a multi-input multiple-output (MIMO) discrete-time filter structure having a plurality of inputs and a plurality of outputs, each input coupled to a sensor of the array of sensors, for shaping quantization errors of the array of sensors on the basis of temporal aspects of the quantized waveforms conjointly with spatial aspects of the quantized waveforms.

In accordance with alternate embodiments, the space-time error-shaping array system may also have a digital multi-channel processor for receiving output signals derived from the plurality of outputs of the MIMO discrete-time filter structure, and for processing the output signals using a statistical model of shaped quantization errors associated with the quantized waveforms.

In accordance with further embodiments of the present invention, the space-time error-shaping array system may have a dimensionality-reduction filter coupled to the plurality of outputs of the MIMO discrete-time filter structure, with the dimensionality-reduction filter having a plurality of output signals. The quantized waveforms, more particularly, may include coarsely quantized waveforms.

In yet further embodiments of the invention, the spatial configuration of the array of sensors may be unconstrained, or may be periodically constrained. The digital multichannel processor may include a beamformer, and, more particularly, a filter-and-sum beamformer.

In accordance with another aspect of the present invention, a method for processing signals is provided that has steps of a. quantizing the signals derived from each of the plurality of sensors to form a temporal signal comprised of quantized waveforms; and
   b. in a MIMO discrete-time filter structure, shaping quantization errors in each of the quantized waveforms using feedback on the basis of temporal aspects of the quantized waveforms conjointly with spatial aspects of the quantized waveforms.

In other embodiments of the invention, there may be a further step of receiving at least one of the quantized waveforms and generating, at a mixer output, bandlimited intermediate frequency (IF) signals. The dimensionality of a plurality of outputs of the MIMO discrete-time filter structure may be reduced in another step.

And, in accordance with further embodiments, the quantized waveforms, more particularly, may include coarsely quantized waveforms, with the spatial configuration of the array of sensors unconstrained, or subject to a specified constraint such as a periodic constrained.

DESCRIPTION OF THE FIGURES

The foregoing features of the invention will be more readily understood by reference to the following detailed description, taken with reference to the accompanying drawings, in which:

FIGS. 4A-4D show regions of frequency-wavenumber space occupied by a signal of interest in distinct front-end cases in accordance with embodiments of the present invention, as discussed in the text.

Figure 1A:
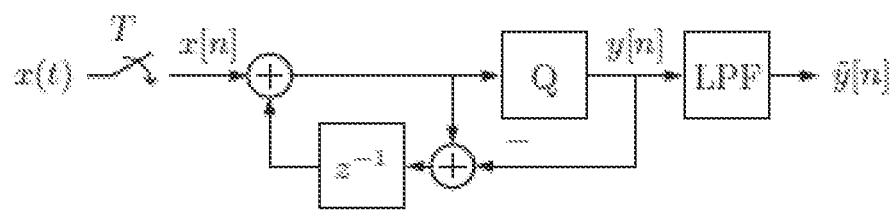
FIG. 1A is a schematic depiction of a prior-art delta-sigma ADC using analog feedback to shape a quantization error spectrum.
Figure 1B:
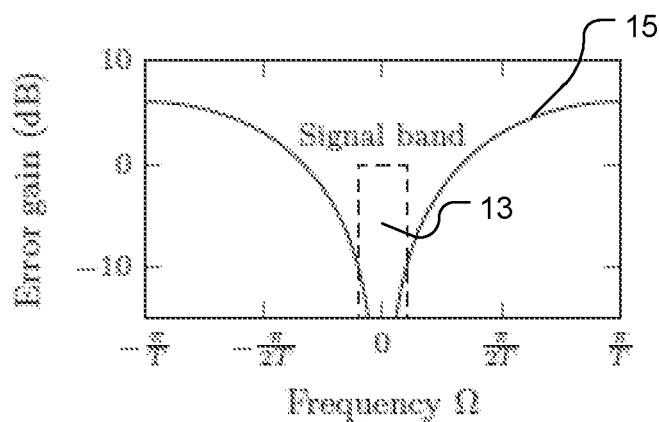
FIG. 1B shows displacement of quantization errors out of a signal band by error shaping in the prior art.

DESCRIPTION OF SPECIFIC EMBODIMENTS
OF THE INVENTION

Definitions: As used in this description and the accompanying claims, the following terms shall have the meanings indicated, unless the context otherwise requires. "Sensor" shall refer to any device that converts the magnitude of a first physical quantity into the magnitude of another physical quantity, wherein the second physical quantity is typically an electrical signal, but is not required to be so, within the scope of the present invention.

The adverb "conjointly" shall refer to the presence of both elements and their application in conjunction with one another.

"Error shaping" shall designate any mechanism or process that manipulates an oversampled signal such that quantization noise is reduced to a level below that of simple signal averaging.

The term "dimensionality-reduction filter" as used herein and in any appended claims, shall refer to any mechanism or process that projects vectors of a set of elements of an array that is oversampled in space and/or time onto vectors of a subspace of lower dimensionality using any algorithm specified in context.

The term "oversample" shall refer to a signal sampled at a frequency, in time or space, exceeding the Nyquist rate.

The term "coarse quantization" arises in the context of a signal, where a function, expandable as $f = \Sigma_{\lambda \in \Lambda} f_\lambda \phi_\lambda$ (with indices $\lambda$ assuming values within some countable set $\Lambda$), is approximated (in some suitable norm) as $\tilde{f} = \Sigma_{\lambda \in \Lambda} f_{\lambda q \lambda}$, with the sequence $(q\lambda)_{\lambda \in \Lambda}$ assuming values in some discrete set D (whence the term "quantization"). "Coarse quantization"

shall refer to a regime where the discrete set D is so small (perhaps binary) that the function $f$ is most effectively approximated by algorithms utilizing the redundancy of the expansion and minimizing the error (quantization error) of the summation over all indices rather than controlling differences (in the norm being employed) on a term-by-term basis. In practical terms, quantization may be binary, but is not required to be so within the scope of the present invention.

A "beamformer" shall refer to any configuration of components that gives rise to directionally shaped estimation of signals from an array of sensors.

"Periodically constrained" arrays of sensors include, but are not limited to, rings or torus structures.

The expression "temporal signals comprising quantized waveforms" includes the possibility that quantized waveforms may pass from one sensor to another for combination (addition, subtraction, etc.) without having been sampled in time first.

In accordance with embodiments of the present invention, earlier analysis is extended to signals with arbitrary spectral occupancy, including wideband signals, narrowband signals sampled at passband, and narrowband signals mixed to an intermediate carrier frequency or to complex baseband. A more versatile oversampled error-shaping array architecture than henceforth possible is enabled by introducing a dimensionality-reduction filter to perform spatial decimation, much like the decimation filter in an error-shaping ADC. An oversampled, coarsely quantized array is modeled by an equivalent array that is finely quantized and not oversampled in space or time; such a system can be used not only for beamforming but also for channel estimation, source localization and tracking, direction-of-arrival and time-difference-of-arrival estimation, and other array processing applications. For spatial filtering applications, it is shown how to incorporate a linear model of the error-shaping structure and an additive noise model of quantization error into the design of a statistically optimal beamformer. Whereas prior works have presented several different first- and second-order error-shaping structures, embodiments of the present invention allow arbitrary error-shaping structures to be analyzed, and enable the design of such structures using tools from discrete-time filter design.

It is shown herein how time-domain error-shaping methods translate to spatial signal processing. Distinctions are drawn that render the two methods not completely analogous, and complications are discussed that arise in implementation, particularly through interactions between the spatial and temporal characteristics of space-time signals. Mathematical analysis and simulation studies show that error shaping can indeed improve the performance of coarsely quantized arrays. The results suggest that, in practical implementations, spatial error shaping is most effective when paired with temporal error shaping.

Techniques described herein, in accordance with the present invention, may advantageously provide benefits of quantization noise reduction in array processing applications that use large numbers of sensors, such as microphone arrays for audio enhancement and machine listening, underwater acoustic communication and radar arrays, and "massive" wireless communication arrays. There has been significant recent interest in coarsely quantized ADCs to reduce the power requirements of large-channel-count communication receivers, and efficient error-shaping ADCs are already integrated directly into the digital MEMS microphones that are used in many embedded microphone arrays.

Space-Time Error Shaping

Figure 3:
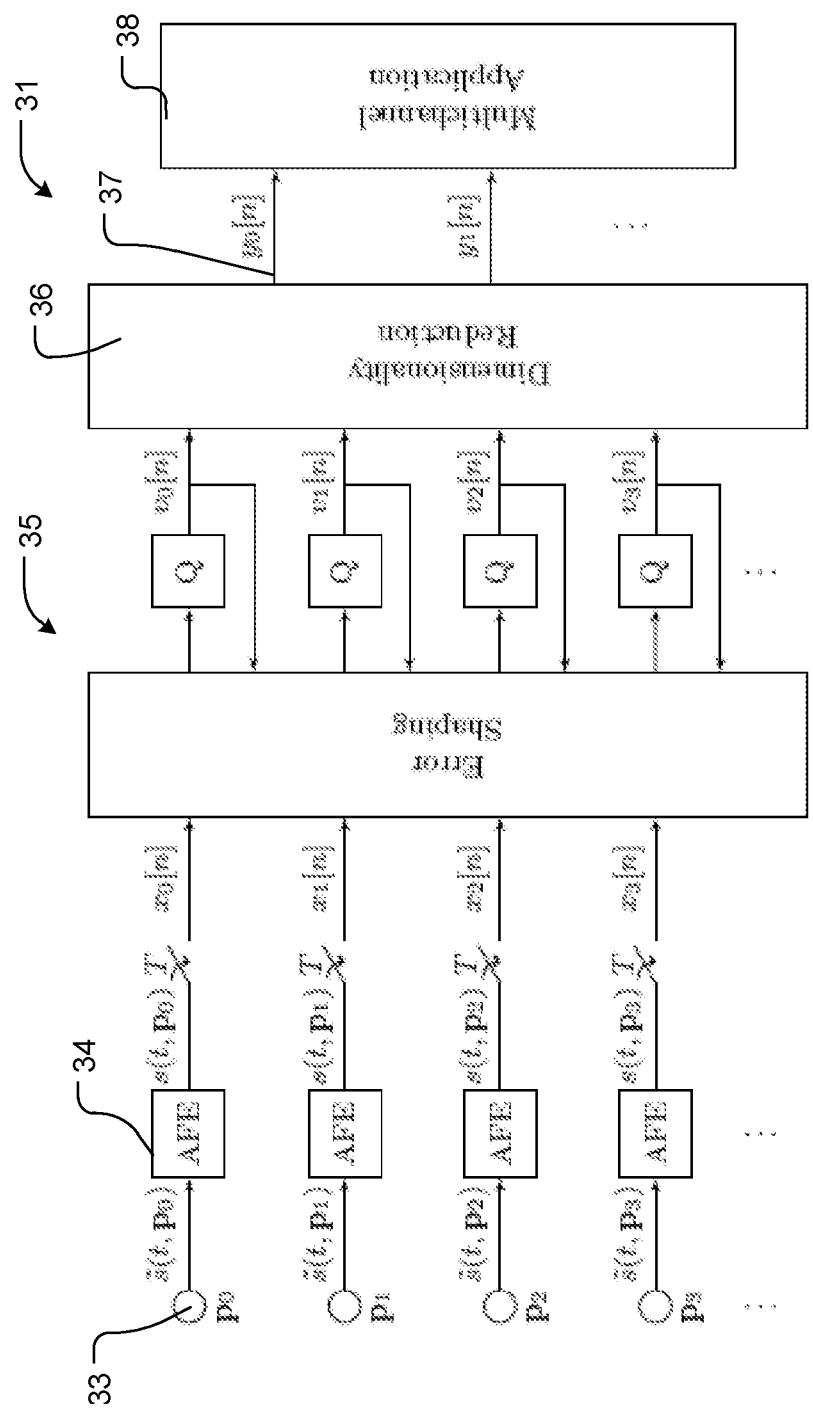
FIG. 3 schematically depicts an array signal processing system in accordance with an embodiment of the present invention, showing an analog front end, low-precision quantizers and a space-time error shaping structure, with decimation by a dimensionality-reduction filter.

Referring to FIG. 3, a space-time error-shaping array system, designated generally by number 31, in now described in accordance with an embodiment of the present invention. An array of sensors 33 captures a space-time signal, which is filtered and mixed, if necessary, by analog front end (AFE) elements 34 and then sampled to form a discrete-time sequence. In a conventional array, these discrete-time sequences would be finely quantized and used to perform multichannel signal processing, such as beamforming or parameter estimation. In a system in accordance with an embodiment of the present invention, the sequences are coarsely quantized by quantizers Q, but the quantization errors are shaped by a multiple-input, multiple-output discrete-time filter structure, designated generally by numeral 35. A dimensionality-reduction structure 36 outputs a smaller number of channels 37 at a lower sample rate, removing much of the shaped quantization error in the process. A multichannel processing application 38 can treat the reduced-dimension output sequences as if they were the finely quantized outputs of a conventional array.

Space-time Signal Model

Let $\tilde{s}(t, p) \in \mathbb{R}$ be a space-time signal with continuous time index $t \in \mathbb{R}$ and spatial coordinate $p \in \mathbb{R}^3$. Let $(t, p) \in \mathbb{C}$ be the signal after processing by the analog front end, which may include filtering and mixing. The signal can be represented in the frequency-wavenumber domain by the Fourier transform relationship $$S_{cc}(\Omega, k) = \int_{-\infty}^{\infty} \int_{\mathbb{R}^3} s(t, p) e^{-j(\Omega t - k^T p)} dp dt, \quad (1)$$

where $\Omega \in \mathbb{R}$ is the continuous-time frequency in radians per unit time and $k \in \mathbb{R}^3$ is the continuous-space wavenumber in radians per unit space. The subscript "cc" indicates that the signal is continuous in time and continuous in space.

The support of $S_{cc}$ in $(\Omega, k)$-space depends on the analog front end, as shown in FIGS. 4A-4D. Without mixing or filtering, a signal propagating in a homogeneous medium must satisfy $\Omega = c|k|$, where c is the speed of propagation in the medium. For a specified reference direction d (e.g. the axis of a linear array), the region of support for the wavenumber component is $$k^T d \leq \frac{\Omega}{c} |d|,$$

as shown in FIG. 4A. This cone 41 is known as the visible region. If the signal of interest lies in a limited frequency band, then it occupies a trapezoidal region 43 of frequency-wavenumber space, as in FIG. 4B. In many applications, particularly for radio frequency, the signal might be mixed to a lower carrier frequency before it is sampled. FIG. 4C shows a bandlimited signal at intermediate frequency (IF) and FIG. 4D shows a bandlimited signal at complex baseband. If the carrier frequency is much larger than the bandwidth, then the signal region is nearly rectangular and the wavenumber depends primarily on the direction of arrival.

The signal is sampled in both space and time to produce a set of discrete-time sequences $x_m[n] = s(nT, p_m)$ for $m = 0, \ldots, M-1$, where T is the sample period, $p_m$ is the position of sensor m, M is the number of sensors, and $n \in \mathbb{Z}$ is a time index. We assume that s(t, p) is bandlimited in space to $|k| \leq k_{max}$ and in time to $|\Omega| \leq \Omega_{max}$. One embodiment of the invention is oversampled by a factor of $L_t$ in time and $L_s$ in space. This requires $L_t \Omega_{max} T \leq \pi$ and that wavenumbers up to $L_s k_{max}$ can be captured without aliasing. For a uniform linear array with spacing d, this means that $L_s k_{max} |d| \leq \pi$. The dashed lines in FIGS. 4C and 4D show the sampled frequency-wavenumber region with $L_s = L_t = 2$.

It is convenient to analyze the array system in the frequency domain. Let $X_d(\omega) \in \mathbb{C}^M$ be the vector of discrete-time Fourier transforms of the sampled sequences, where $\omega \in [-\pi, \pi]$ is the discrete-time frequency variable. Assuming that the sensors are linear, we can express $X_d(\omega)$ in terms of $S_{cc}(\Omega, k)$ as $$X_d(\omega) = \int_{\mathbb{R}^3} S_{cc}\left(\frac{\omega}{T}, k\right) A(\omega, k) \frac{dk}{(2\pi)^3}, \quad (2)$$

where $A(\omega, k) \in \mathbb{C}^M$ is called the array manifold. It describes the output of the array in response to a plane wave $s(n, p) = e^{j(\omega n - k^T p)}$. For ideal isotropic sensors, the manifold consists of pure delays $A_m(\omega, k) = e^{-jk^T p_m}$ for $m = 0, \ldots, M-1$ and does not depend on $\omega$. More generally, however, an array manifold reflects the positions, directivities, frequency responses, and mutual coupling of the sensors.

The output of the foregoing system is the set of sequences $y_k[n]$ for $k = 0, \ldots, K-1$, where K is the number of output channels. In the next section, the nonlinear digitization process will be modeled as a linear system with additive noise. An objective of this modeling is an effective array manifold $A_{eff}(\omega, k)$ such that $$Y_d(\omega) = \int_{\mathbb{R}^3} S_{cc}\left(\frac{\omega}{L_t T}, k\right) A_{eff}(\omega, k) \frac{dk}{(2\pi)^3} + E_d(\omega), \quad (3)$$

where $Y_d(\omega)$ and $E_d(\omega) \in \mathbb{C}^K$ are the discrete-time Fourier transforms of the output sequences and of effective noise sequences, respectively.

Error-shaping Structure

The sampled signal is quantized and the resulting quantization errors are shaped using temporal feedback, spatial feedback, or both. For example, in the first-order spatial error-shaping structure 21 shown in FIG. 2, quantization error from each sensor channel is subtracted from the input of the next channel. Denote the discrete-time, discrete-value output sequences of the quantizers by $v_m[n]$ for $m = 0, \ldots, M-1$. For heuristic purposes, embodiments of the present invention are described in terms of linear time-invariant error-shaping feedback, although the scope of the invention is not so limited. The output is given by $$v_m[n] = Q\left\{ \sum_{r=0}^{M-1} (g_{m,r}^{(x)} * x_r)[n] + (g_{m,r}^{(v)} * v_r)[n] \right\}, \quad (4)$$

for $m = 0, \ldots, M-1$, where $Q\{\bullet\}$ represents quantization, * is linear convolution, and $g_{m,r}^{(x)}[n]$ and $g_{m,r}^{(v)}[n]$ are discrete-time, continuous-value filter coefficients. The choice of these coefficients is discussed below in the context of designing error-shaping structures. If the array signals are sampled in complex baseband, then $Q\{\bullet\}$ acts separately on the real and imaginary parts.

To analyze the error-shaping effect of the filter structure, the quantization error sequences $q_m[n] = v_m[n] - \bar{v}_m[n]$ are defined for $m = 0, \ldots, M-1$, where $\bar{v}_m[n]$ is the input to the quantizer in channel m. Thus, quantization is equivalent to an additive noise process. The outputs may be written in terms of x and q as $$v_m[n] = \sum_{r=0}^{M-1} (h_{m,r}^{(x)} * x_r)[n] + (h_{m,r}^{(q)} * q_r)[n], \quad (5)$$

for $m = 0, \ldots, M-1$, where $h_{m,r}^{(x)}[n]$ and $h_{m,r}^{(q)}[n]$ are unit pulse responses of the structure acting on the input sequences and quantization error sequences, respectively. They can be computed from $g_{m,r}^{(x)}$ and $g_{m,r}^{(v)}$. Let $H_x(z)$ and $H_q(z)$ be M×M transfer function matrices whose m, r elements are the z-transforms of $h_{m,r}^{(x)}[n]$ and $h_{m,r}^{(q)}[n]$, respectively. In the frequency domain, the error-shaping structure output vector $V_d(\omega) \in \mathbb{C}^M$ is given by $$V_d(\omega) = H_x(e^{j\omega}) X_d(\omega) + H_q(e^{j\omega}) Q_d(\omega). \quad (6)$$

If the error-shaping structure is effective, then the signal and error components of $V_d(\omega)$ will be relatively uncorrelated. The error can therefore be reduced by projecting the quantizer outputs into the subspace of the signal component. This projection process corresponds to the decimation step in a temporal error-shaping system. Let B(z) be a K×M transfer function matrix representing a set of discrete-time dimensionality-reduction filters. If the system is oversampled in space by a factor of $L_s$, then $K = M/L_s$ may be chosen. If the system is oversampled in time, then B(z) will incorporate temporal decimation filters and the output will be downsampled by a factor of $L_t$. If the decimation filters are ideal so that there is no aliasing, then the overall system output is therefore $$Y_d(\omega) = B(e^{j\omega/L_t}) V_d(e^{j\omega/L_t}). \quad (7)$$

The output is equivalent to that generated by an array of K sensors sampled at rate $T/L_t$ and finely quantized. With ideal decimation filters, the effective array manifold and error are, respectively, $$A_{eff}(\omega, k) = B(e^{j\omega/L_t}) H_x(e^{j\omega/L_t}) A\left(\frac{\omega}{L_t}, k\right), \text{ and} \quad (8)$$

$$E_d(\omega) = B(e^{j\omega/L_t}) H_q(e^{j\omega/L_t}) Q_d\left(\frac{\omega}{L_t}\right). \quad (9)$$

It is desirable to design the error-shaping and dimensionality-reduction structures so that $A_{eff}(\omega, k)$ is approximately that of a conventional array and $E_d(\omega)$ is small relative to other error sources such as noise. This design problem may be difficult for small arrays with nonuniform geometry. However, if it is assumed that the array is large and has a regular structure, then tools from discrete-time filter design may be leveraged to synthesize effective error-shaping and dimensionality-reduction structures.

Design of Error-Shaping Structures

Space-invariant Model

To more easily analyze and design error-shaping structures, the duality between spatial and temporal signal processing is leveraged once again. Suppose that the error-shaping structure is shift-invariant with respect to the sensor indices, that is, $h_{m,r}^{(x)}[n] = \bar{h}_{m-r}^{(x)}[n] = \bar{h}_{m-r}^{(q)}[n]$ depend on m and r only by their difference m−r. Then the output of the error-shaping structure is given by a spatial convolution sum:

$$v_m[n] = \sum_{r=-\infty}^{\infty} (\bar{h}_{m-r}^{(x)} * x_r)[n] + (\bar{h}_{m-r}^{(q)} * q_r)[n]. \quad (10)$$

Since the array is finite in length, $x_m[n]=0$ and $q_m[n]=0$ is defined for m<0 and m≥M. The shift-invariance assumption allows for replacement of the vector transfer functions $H_x(z)$ and $H_q(z)$ with the scalar transfer functions $\bar{H}_x(z, u)$ and $\bar{H}_q(z, u)$, where $$\bar{H}(z, u) = \sum_{m=-\infty}^{\infty} \sum_{n=-\infty}^{\infty} \bar{h}_m[n] u^{-m} z^{-n}. \quad (11)$$

Here $u^{-1}$ represents a spatial "delay", analogous to $z^{-1}$ for time delays.

This scalar transfer function representation is particularly useful if the spatial sampling pattern, that is, the array geometry, is regular. Suppose that $p_m = md$ and for some distance vector $d \in \mathbb{R}^3$. Let $\psi = k^T d \in [-\pi, \pi]$ be the discrete-space wavenumber variable. Then the discrete-time Fourier transform vector $X_d(\omega)$ may be replaced with the discrete-time, discrete-space Fourier transform scalar $X_{dd}(\omega, \psi)$, which is given by $$X_{dd}(\omega, \psi) = \sum_{m=-\infty}^{\infty} X_m(\omega) e^{jm\psi}. \quad (12)$$

Once again, $X_m(\omega)=0$ is defined for m<0 and m≥M. Furthermore, although the quantization error $Q_d(\omega)$ is not a sampled space-time signal, it too has a frequency-wavenumber representation:

$$Q_{dd}(\omega, \psi) = \sum_{m=-\infty}^{\infty} Q_m(\omega) e^{jm\psi}. \quad (13)$$

Thus, the quantization error may be modeled as a sampled space-time signal that is not restricted to the visible region. Error shaping may thus be used advantageously, in accordance with the present invention, to push the frequency-wavenumber distribution of the quantization error outside the visible region.

The space-invariance assumption may be used to write the output of the error-shaping structure as a single scalar equation:

$$V_{dd}(\omega, \psi) = \bar{H}_x(e^{j\omega}, e^{-j\psi}) X_{dd}(\omega, \psi) + \bar{H}_q(e^{j\omega}, e^{-j\psi}) Q_{dd}(\omega, \psi). \quad (14)$$

For multidimensional arrays, the spatial sampling pattern is required to be periodic in two or more directions and the error-shaping grid is required to be shift-invariant in those same directions. Then multiple u and ψ variables may be used, as well as multidimensional convolution in Eqn. (10), and multidimensional transforms in Eqns. (11-13). For example, for a two-dimensional array aligned along $d_1$ and $d_2$, Eqn. (14) would take the form $$V_{dd}(\omega, \psi_1, \psi_2) = \bar{H}_x(e^{j\omega}, e^{-j\psi_1}, e^{-j\psi_2}) X_{dd}(\omega, \psi_1, \psi_2) + \quad (15)$$
$$\bar{H}_q(e^{j\omega}, e^{-j\psi_1}, e^{-j\psi_2}) Q_{dd}(\omega, \psi_1, \psi_2),$$

where $\psi_1 = k^T d_1$ and $\psi_2 = k^T d_2$.

Under the shift-invariant model, the dimensionality-reduction filter also becomes a scalar transfer function $\bar{B}(z, u)$. It should approximate an ideal space-time decimation filter:

$$\bar{B}_{ideal}(e^{j\omega}, e^{-j\omega}) = \begin{cases} 1, & \text{if } |\omega| \leq \frac{\pi}{L_t} \text{ and } |\psi| \leq \frac{\pi}{L_s} \\ 0, & \text{otherwise} \end{cases}. \quad (16)$$

The corresponding input-output relation is $$y_k[l] = \sum_{n=-\infty}^{\infty} \frac{\sin\left(\pi \frac{n - L_t l}{L_t}\right)}{\pi(n - L_t l)} \sum_{m=-\infty}^{\infty} \frac{\sin\left(\pi \frac{m - L_s k}{L_s}\right)}{\pi(m - L_s k)} v_m[n]. \quad (17)$$

For a long uniform linear array, the dimensionality-reduction structure is simply a K×M scalar gain matrix followed by K decimators. For the ideal space-time dimensionality-reduction filter, the overall system output in frequency-wavenumber space is given by $$Y_{dd}(\omega, \psi) = V_{dd}(\omega/L_t, \psi/L_s). \quad (18)$$

Transfer Function Design

The space- and time-invariant model allows for the design of error-shaping structures as if they were discrete-time filters. To ensure that the signal of interest is not distorted, $\bar{H}_x(e^{j\omega}, e^{-j\psi}) \approx 1$ should obtain over the signal's region of support, $$|\omega| \leq \frac{\pi}{L_t} \text{ and } |\psi| \leq \frac{\pi}{L_s}.$$

To reduce quantization error, $\bar{H}_q(e^{j\omega}, e^{-j\psi}) \approx 0$ should obtain over that same region. Like many delta-sigma ADCs, the structures presented in this section have unity gain in the signal path, that is, $\bar{H}_x = 1$ everywhere, so attention is focussed on the error shaping gain.

Figure 5A:
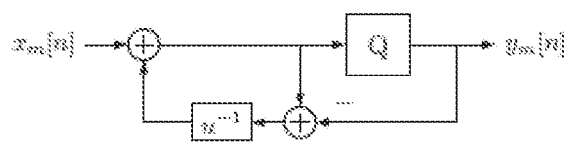
FIGS. 5A-5C depict three space-time error-shaping transfer structures discussed in the text, along with corresponding wavenumber-frequency response.
Figure 5A:
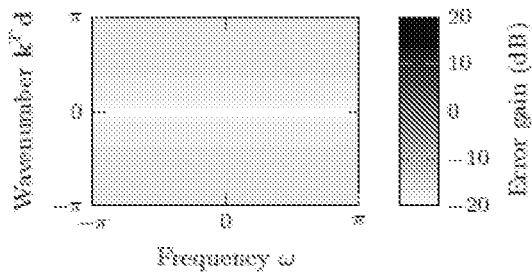
Figure 5B:
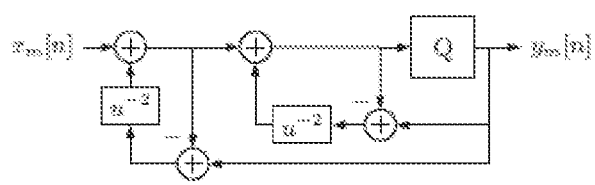
Figure 5B:
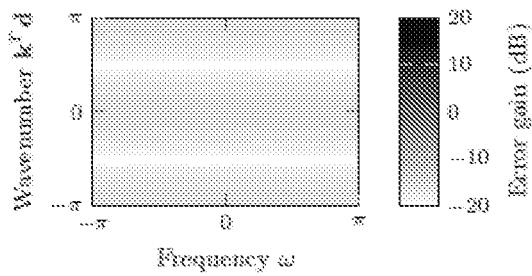
Figure 5C:
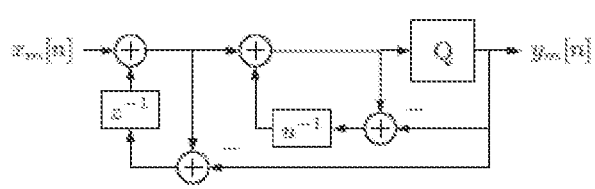
Figure 5C:
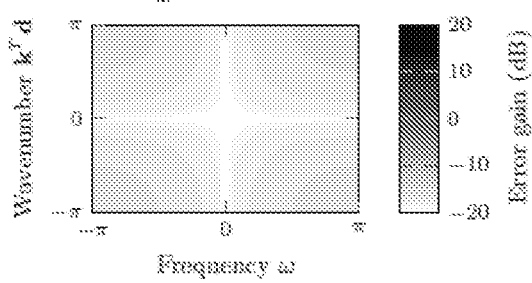

FIGS. 5A-5C show several space-time error-shaping structures and their associated frequency-wavenumber magnitude-squared responses $|\bar{H}_q(e^{j\omega}, e^{-j\psi})|^2$. Structure 51 in FIG. 5A is identical to that in FIG. 2 and shows first-order spatial error shaping. Note that this diagram represents the circuits attached to all M elements in the array; the $u^{-1}$ block represents propagation from one sensor to the next. For this structure, $\bar{H}_x(z, u) = 1$ and $\bar{H}_q(z, u) = 1 - u^{-1}$. The error gain is therefore $$|\bar{H}_q(e^{j\omega}, e^{-j\psi})|^2 = 4 \sin^2(\psi/2). \quad (19)$$

Quantization errors are shaped to large wavenumbers. If the array is spatially oversampled, then the error resembles a space-time signal that impinges on the array predominantly from the so-called invisible region of wavenumber space where propagating waves cannot exist. The quantization error in the output will be smallest near broadside ($\psi=0$) and largest near endfire ($\psi=\pm\pi/L_s$).

If the array is not spatially oversampled, then spatial error shaping can still be performed as long as it is assumed that the signal of interest is spatially bandlimited. For example, suppose that a narrowband signal is known to arrive from a narrow angular interval near 30° from broadside. A second-order spatial shaping structure 52 in FIG. 5B has a bandstop spatial characteristic that reduces quantization error where the wavenumber component along the array axis is close to a quarter-wavelength, or 30° from broadside for a half-wavelength-spaced array. This design is inspired by bandpass delta-sigma ADCs described by Schreier 2005.

If the array is oversampled in both space and time, then spatial and temporal error shaping may be combined, in accordance with embodiments of the invention. FIG. 5C shows a space-time error-shaping structure 53 that uses spatial propagation and temporal feedback with transfer function $\overline{H}_q(z,u)=(1-u^{-1})(1-z^{-1})$. As discussed in further detail below, shaping quantization errors of the array of sensors on the basis of temporal aspects of the quantized signals conjointly with spatial aspects of the quantized signals may advantageously improve the stability and performance of an oversampled array.

The frequency-wavenumber error gains shown are for infinitely long uniform linear arrays, which are not realizable. However, as with discrete-time filter design, the structures designed using the space-invariant model can be applied to finite-length arrays with nonuniform geometries. The size and layout of the array will determine how much the error gain deviates from the ideal design.

Performance Scaling

The achievable performance of the error-shaping array depends in part on the error-shaping modulation order and the spatial and temporal oversampling ratios. Consider an infinitely long uniform linear array with shift-invariant order-$p_t$ temporal and order-$p_s$ spatial error shaping and frequency-wavenumber responses $\overline{H}_x(z, u)=1$ and $\overline{H}_q(z, u)=(1-z^{-1})^{p_t}(1-u^{-1})^{p_s}$. Suppose that the dimensionality-reduction filter is an ideal space-time decimator. If the unshaped quantization error sequence is spatially and temporally uncorrelated with power $P_q$, then the output error power is $$P_e = \int_{-\pi}^{\pi}\int_{-\pi}^{\pi} |\overline{B}(e^{j\psi}, e^{-j\psi})\overline{H}_q(e^{j\omega}, e^{-j\psi})|^2 P_q \frac{d\omega}{2\pi} \frac{d\psi}{2\pi} \quad (20)$$

$$= P_q \int_{-\pi/L_s}^{\pi/L_s} \left(2\sin\frac{\psi}{2}\right)^{2p_s} \frac{d\psi}{2\pi} \int_{-\pi/L_t}^{\pi/L_t} \left(2\sin\frac{\omega}{2}\right)^{2p_t} \frac{d\omega}{2\pi} \quad (21)$$

$$= P_q \left(\frac{\pi^{2p_s}}{(2p_s+1)L_s^{2p_s+1}} + O\left(\frac{1}{L_s^{2p_s+3}}\right)\right) \cdot \quad (22)$$

$$\left(\frac{\pi^{2p_t}}{(2p_t+1)L_t^{2p_t+1}} + O\left(\frac{1}{L_t^{2p_t+3}}\right)\right)$$

Eqn. (22) illustrates performance scaling for large $L_s$ and large $L_t$. With no error shaping, the system gains about 0.5 bits of resolution per doubling of either $L_s$ or $L_t$. For first-order spatial (respectively temporal) error shaping, it gains about 1.5 bits per doubling of $L_s$ (respectively $L_t$). With second-order error shaping, it gains 2.5 bits, and so on.

These scaling trends imply that to increase the resolution of the system, the designer can increase either the spatial or the temporal oversampling ratio. Having understood the teachings provided herein, a person of ordinary skill in the art can select the spatial and temporal orders of the error-shaping circuit based on the available oversampling ratios and the size and speed of the analog circuits. Note that these scaling trends rely on the assumptions that analog filtering is instantaneous, that the quantization error sequence is spatially and temporally uncorrelated and that the feedback system remains stable. These assumptions are addressed in further detail in the following section.

Implementation Considerations

Sample-and-hold Delays

The analysis in the previous section assumes that the error-shaping transfer functions can be exactly implemented using analog circuits. However, these circuits cannot propagate signals instantly from one sensor to the next. While the circuit delays might be negligible in small microphone arrays at audible frequencies, they cannot be ignored in antenna arrays. To ensure that the transfer functions can be implemented in hardware, temporal delays should be inserted in the spatial feedback loop. This limits the length of the critical path and allows the quantization and addition circuits time to adjust to new signal values.

Figure 6:
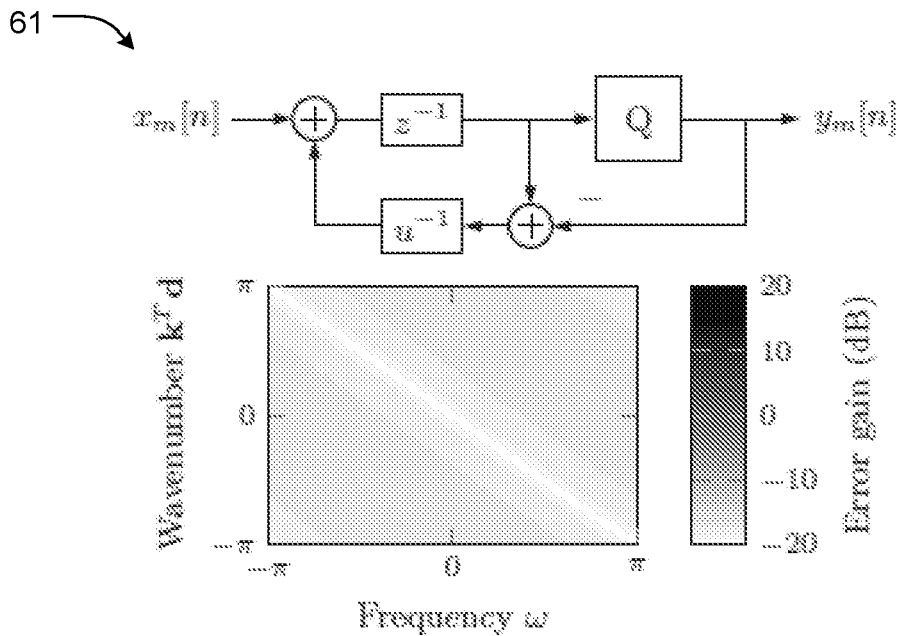
FIG. 6 depicts a first-order spatial error-shaping structure with a delay in accordance with an embodiment of the present invention, and a corresponding wavenumber-frequency response.

FIG. 6 shows a first-order spatial error-shaping structure 61 with a delay, that is, a sample-and-hold circuit, connected to the quantizer Q. Its error transfer function is $H_q(u, z)=1-z^{-1}u^{-1}$. The corresponding error gain for an infinitely long uniform linear array is
which shapes quantization errors diagonally in frequency-wavenumber space. This structure would be appropriate only if the temporal oversampling ratio is large compared to the spatial oversampling ratio, as is typical for audio applications; if it is smaller, then quantization errors are pushed into the visible region rather than out of it.

Figure 7:
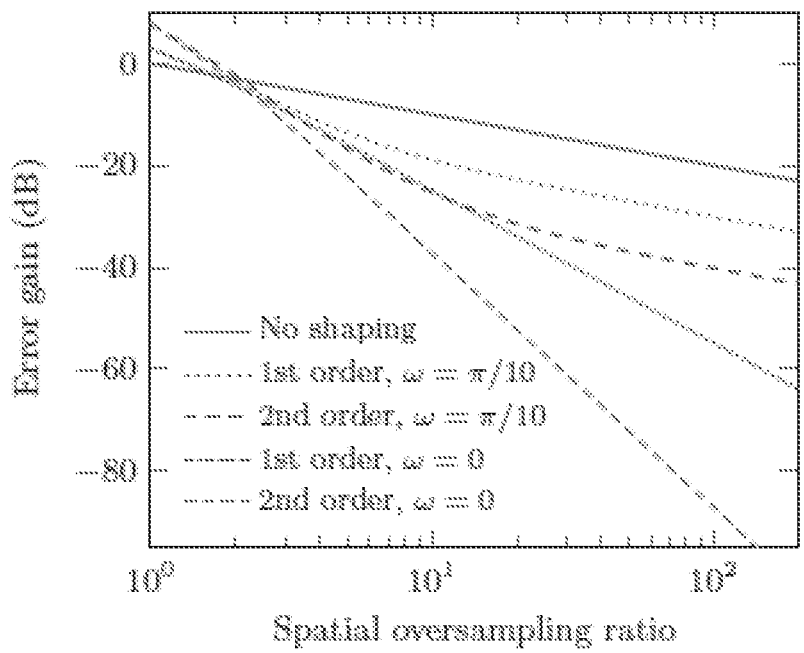
FIG. 7 plots error gain at the output of an ideal beam former with sample-and-hold delays for various spectral error-shaping structures.

FIG. 7 shows noise reduction as a function of spatial oversampling ratio for several error-shaping structures with sample-and-hold delays. The $\omega=0$ curves follow Eqn. (21). The $\omega=\pi/10$ curves show that if the sample-and-hold delays are not compensated, then error shaping is ineffective for spatial oversampling ratios larger than the temporal oversampling ratio.

Figure 8:
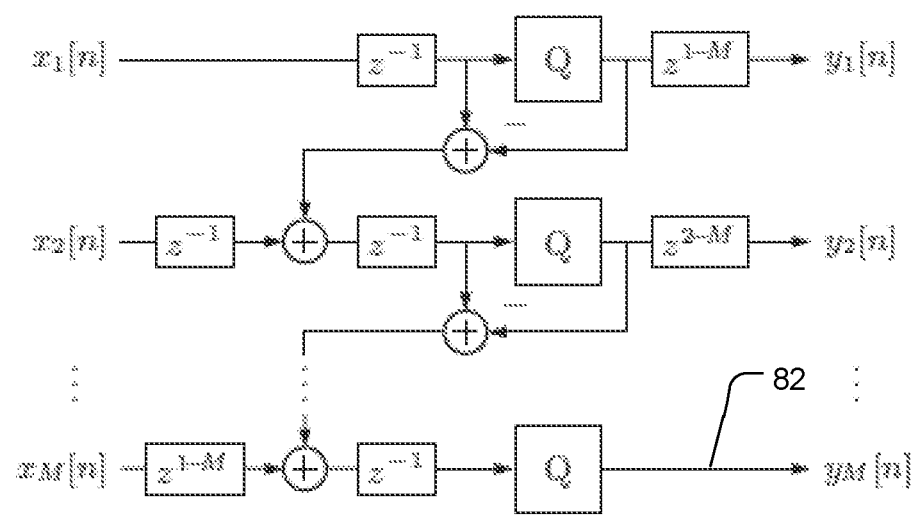
FIG. 8 is a schematic depiction of a staggered-delay error-shaping structure, in accordance with an embodiment of the present invention, equivalent to the structure of FIG. 5A, except for an overall delay.

To preserve the gain pattern of the instantaneous structure in a realizable system, staggered delays may be added to align the outputs and quantization errors in time. FIG. 8 shows a delay-aligned first-order spatial error-shaping structure 81. Each output 82 is delayed by M−1 samples relative to the original structure.

Figure 2:
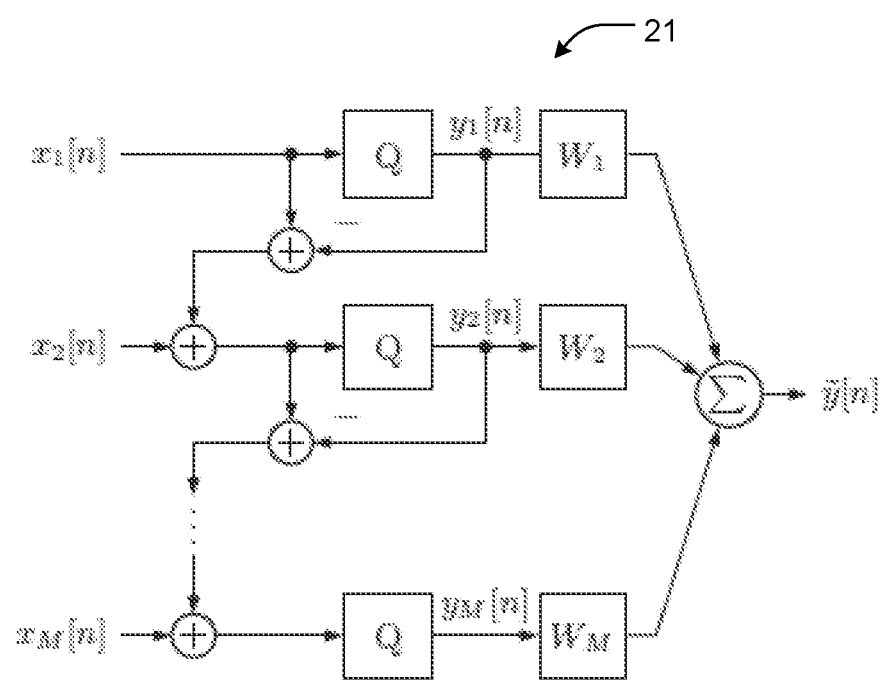
FIG. 2 is an exemplary depiction of a prior art beam forming array.

It is to be understood that, within embodiments of the present invention, quantized and unquantized values may be passed between sensors asynchronously, in a structure 21 such as that depicted in FIG. 2, where the inputs have already been sampled in time but may be asynchronous since there is no loop.

Quantization Error Statistics

To predict the performance of a system that uses error shaping, the signal and errors may be modeled as space-time random processes. In error-shaping ADC analysis, it is typically assumed that the error sequences are temporally uncorrelated and that they are uncorrelated with each other and with the input signal. However, except for internal circuit noise, q[n] is in fact a deterministic function of x[n], x[n−1], . . . ; therefore this assumption must be justified. An extreme case is a linear array of noiseless sensors measuring a single plane wave from broadside: without spatial error shaping, the quantization error sequences of the sensors are identical.

Figures 9A, 9B, 9C, 9D:
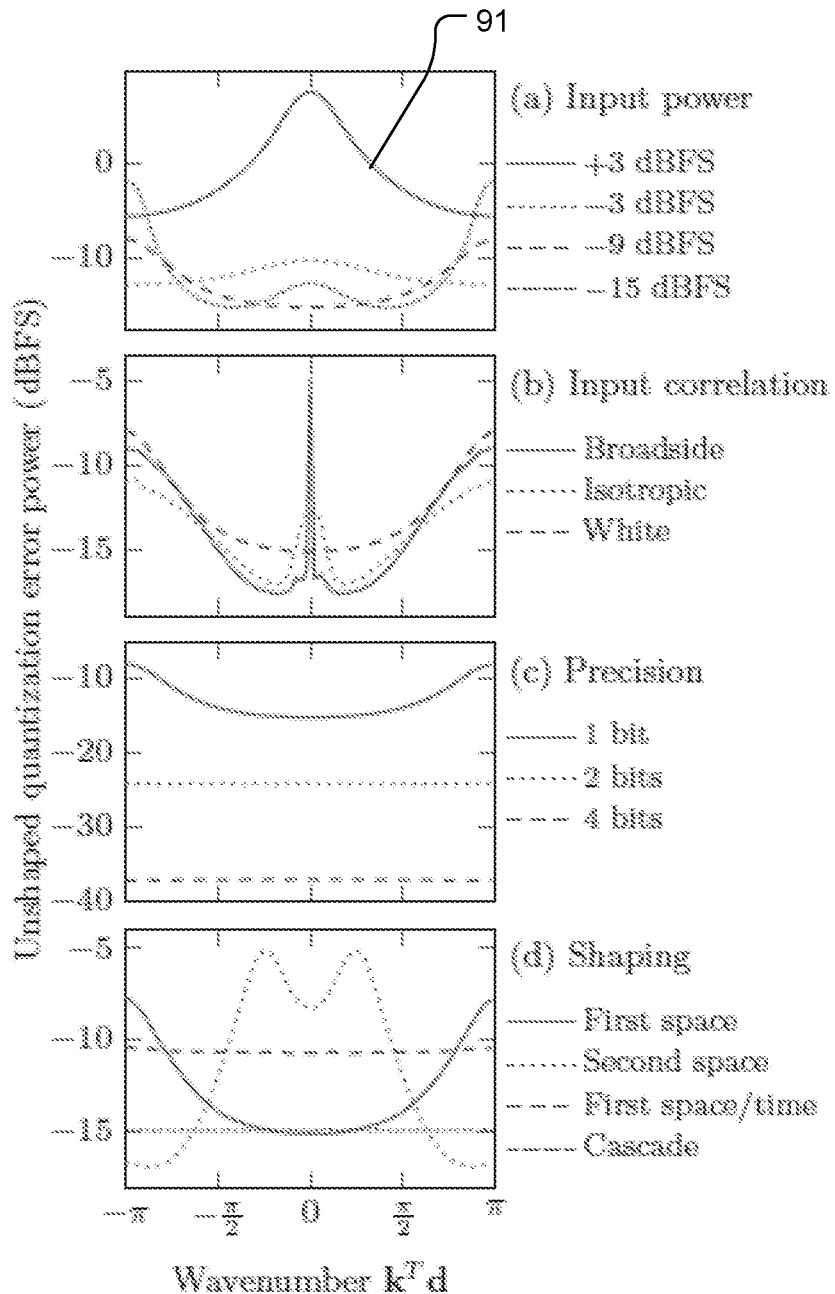
FIGS. 9A-9D show simulated wavenumber spectra for several error shaping scenarios in accordance with embodiments of the present invention.

It is difficult to model the statistics of the nonlinear error-shaping system. However, there are a number of empirical results from time-domain error shaping that can be extended to space-time error shaping. In error-shaping ADCs, quantization error sequences have been found to be more noiselike for fine quantizers and cascade structures than for coarse quantizers and non-cascade structures, as discussed by Schreier 2005. The array structures considered here include more quantizers than a temporal error-shaping ADC and can shape errors over both space and time, offering even more opportunity to reduce correlations. FIGS. 9A-9D show the simulated wavenumber spectrum 91 of the unshaped error sequences $q_m[n]$ for several error-shaping structures applied to a uniform linear array of two hundred ideal isotropic sensors with $L_s=L_t=10$ and complex baseband sampling. The baseline system parameters, one of which is varied for each plot, are as follows: spatially and temporally uncorrelated Gaussian noise with power −9 dBFS as the input signal, one-bit quantization, and first-order spatial error shaping. The following parameters have a significant impact on the second-order statistics of the quantization error sequence:

Input dynamic range: The quantization error spectrum takes different shapes depending on the dynamic range of the input signal relative to the range of the quantizer. FIG. 9A shows the spectra for different input powers. If the signal regularly exceeds the range of the quantizer, then the quantization error signals will grow as they propagate through space, leading to a spectrum with strong low-wavenumber components. If the signal is small relative to the quantizer levels, then the quantization error signals will alternate in sign, leading to high-wavenumber components.

Input correlation: The spatial correlation of the input signal determines the spatial correlation of the quantization error signal. FIG. 9B shows the quantization error wavenumber spectra for a broadside signal, which is identical at each sensor, white noise, which is uncorrelated between sensors, and cylindrically isotropic noise, which spans the visible region of wavenumber space. Mutual coupling tends to increase the spatial correlation of an input signal, making it resemble the broadside signal, while sensor noise decreases the correlation, making it look like the white signal. The unshaped quantization error spectrum has stronger low-wavenumber correlations for the broadside and isotropic signals than for the white signal.

Quantizer precision: The precision of the quantizer strongly affects the statistics of the unshaped error sequence. FIG. 9C shows the wavenumber spectra for quantizers with different numbers of bits. As in time-domain error shaping, spatial error-shaping structures with multibit quantizers produce approximately independent quantization error sequences. More precise quantizers also produce smaller errors. However, special care must be taken to ensure linearity in a multibit error-shaping structure, as discussed by Geerts 2006.

Shaping structure: FIG. 9D shows the unshaped quantization error wavenumber spectra for different error-shaping structures. The spatial-only error-shaping structures have correlated quantization error sequences, which may either enhance or counteract the error-shaping effects of the system. Meanwhile, the structures that incorporate both spatial and temporal error shaping have weakly correlated error sequences. The cascade structure, which will be introduced in the following section, has the weakest correlations.

Cascade Structures

Figure 10:
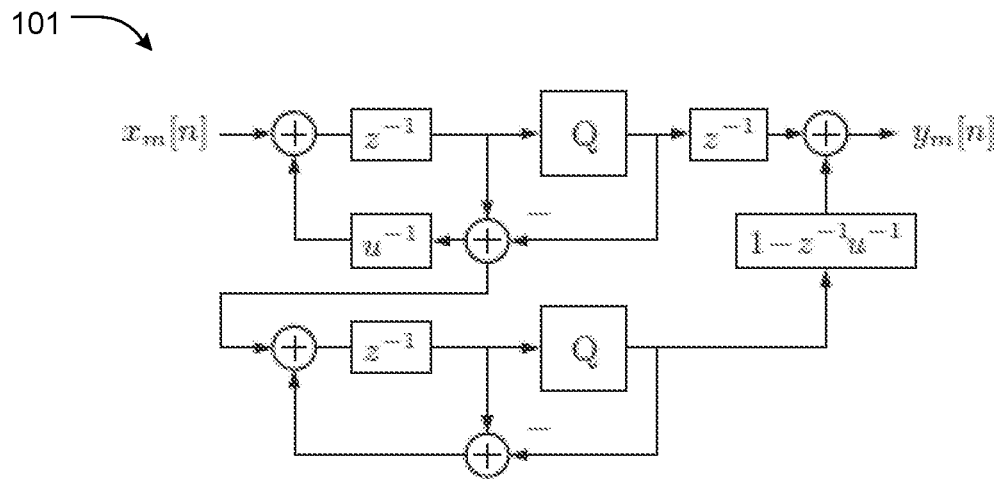
FIG. 10 is a schematic depiction of a cascade structure using multiple quantizers to improve stability, in a accordance with an embodiment of the present invention.

Like time-domain error-shaping systems, space-time error-shaping filters often deviate from the linear model discussed above. The nonlinear quantization operation can cause instability in higher-order error-shaping filters and temporal and spatial correlations between quantization error sequences can counteract the error-shaping effects of the filter transfer function. Both of these problems can be addressed using cascade structures, sometimes known in the ADC literature as multistage noise shaping (MASH). Cascade structures use multiple quantizers, each with a lower-order feedback loop, to create a higher-order transfer function. The negative quantization error of the first loop is the input to the second. They are less susceptible to instability than equivalent structures with a single quantizer, as shown in Schreiber 2005. Furthermore, the additional stage of nonlinearity reduces correlations in the error sequences, as shown above. FIG. 10 shows a first-order cascade structure 101 with error transfer function $\overline{H}_q(z, u)=(1-z^{-1}u^{-1})(1-z^{-1})$. The outputs of the two quantizers Q are combined using a digital filter that cancels the error of the first quantizer and shapes the error of the second.

Application Study: Beamforming

The space-time error-shaping array described in accordance with embodiments of the present invention may be used advantageously in many applications for which a conventional array is used. In applications that use statistical models of the sampled space-time signal, we can substitute the effective array manifold and noise model (3) for a conventional array to account for any distortion introduced by the error-shaping structure and to model the remaining quantization error after dimensionality reduction. In the following section, one application is presented solely by way of example: statistically optimal beamforming.

Statistically Optimal Beamforming

Figure 11:
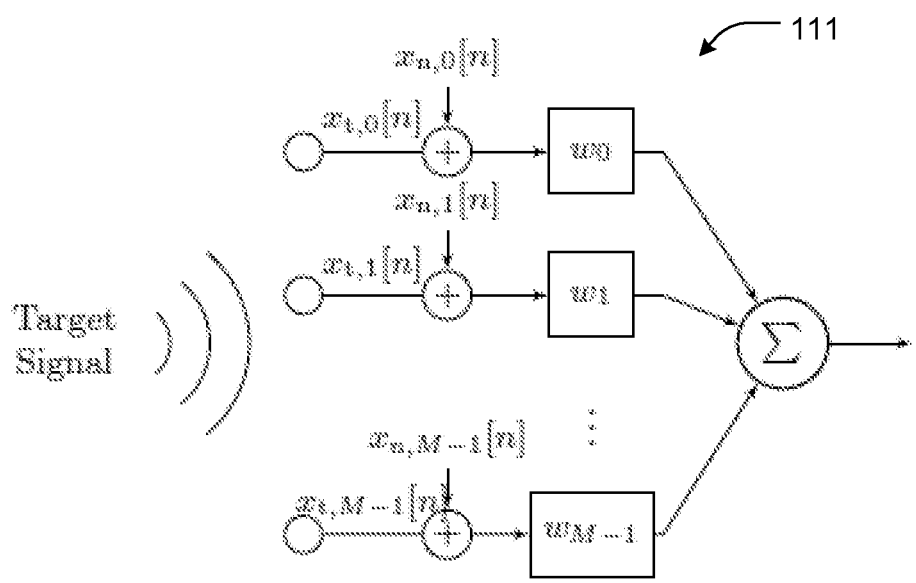
FIG. 11 schematically depicts a filter-and-sum beam former in accordance with an embodiment of the present invention.

A statistically optimal beamformer in accordance with an embodiment of the present invention uses a multiple-input, single-output filter 111, like that in FIG. 11, to isolate a signal of interest from un-wanted noise. Typically, both the target and noise signals are modeled as wide-sense stationary random processes, and filters are designed to minimize a statistical cost function. Assume that $x[n]=x_t[n]+x_n[n]$, where $x_t[n]$ is due to a target signal and $x_n[n]$ consists of unwanted noise that is uncorrelated with $x_t[n]$. Let $R_{x_n}(\omega)$ be the M×M power spectral density (PSD) of $x_n[n]$, assumed to have full rank for all ω in the signal passband. The filter-and-sum beamformer coefficients $\omega_m$, [n], m=0, ..., M−1, can be chosen in several ways depending on the parameters of the problem and the constraints of the application. For example, for an error-free array with manifold A(ω, k), the minimum variance distortionless response (MVDR) beamformer that minimizes noise power subject to a distortionless constraint on a far-field signal $x_t[n]$ with wavenumber $k_0$ is $$W(\omega) = \frac{R_{x_n}^{-1}(\omega)A(\omega, k_0)}{A^H(\omega, k_0)R_{x_n}^{-1}(\omega)A(\omega, k_0)}, \quad (24)$$

as discussed by Van Trees, *Optimum Array Processing*, Wiley (2002), incorporated herein by reference.

As shown above, under appropriate circumstances, q[n] may be modeled as a wide-sense stationary random noise process. This model allows quantization error to be treated as part of the unwanted noise signal. Thus, a beamformer that acts on the outputs $y_m[n]$ of the dimensionality-reduction structure may be designed. Assume that $q[n]$ is uncorrelated with $x[n]$ and has unshaped PSD $R_q(\omega)$. Let $$R_e(\omega) = B(e^{j\omega/L_t})H_q(e^{j\omega/L_t})R_q\left(\frac{\omega}{L_t}\right)H_q^H(e^{j\omega/L_t})B^H(e^{j\omega/L_t}) \text{ and}$$

$$R_{y_n}(\omega) = B(e^{j\omega/L_t})H_x(e^{j\omega/L_t})R_{x_n}\left(\frac{\omega}{L_t}\right)H_x^H(e^{j\omega/L_t})B^H(e^{j\omega/L_t})$$

be the PSDs of the processed signal components. Let $A_{eff}(\omega, k)$ be the effective manifold from Eqn. (8). The MVDR beamforming filter coefficients are given by $$W(\omega) = \frac{(R_{y_n}(\omega) + R_e(\omega))^{-1} A_{eff}(\omega, k_0)}{A_{eff}^H(\omega, k_0)(R_{y_n}(\omega) + R_e(\omega))^{-1} A_{eff}(\omega, k_0)}. \quad (25)$$

Simulation Results

To demonstrate the error-shaping performance of the overall beamforming system, a uniform linear array of two hundred ideal isotropic sensors was simulated with a spatial oversampling ratio of ten. The beamformer used either no error shaping or the space-time cascade structure 101 shown in FIG. 10. The target signal is a real-valued bandlimited Gaussian noise source located 30° from broadside. There are eight interference signals, also Gaussian noise sources of variable power, located at several other angles. The mixture is generated assuming far-field anechoic propagation. The internal sensor noise is independent Gaussian noise 30 dB below the target source power.

Figure 12:
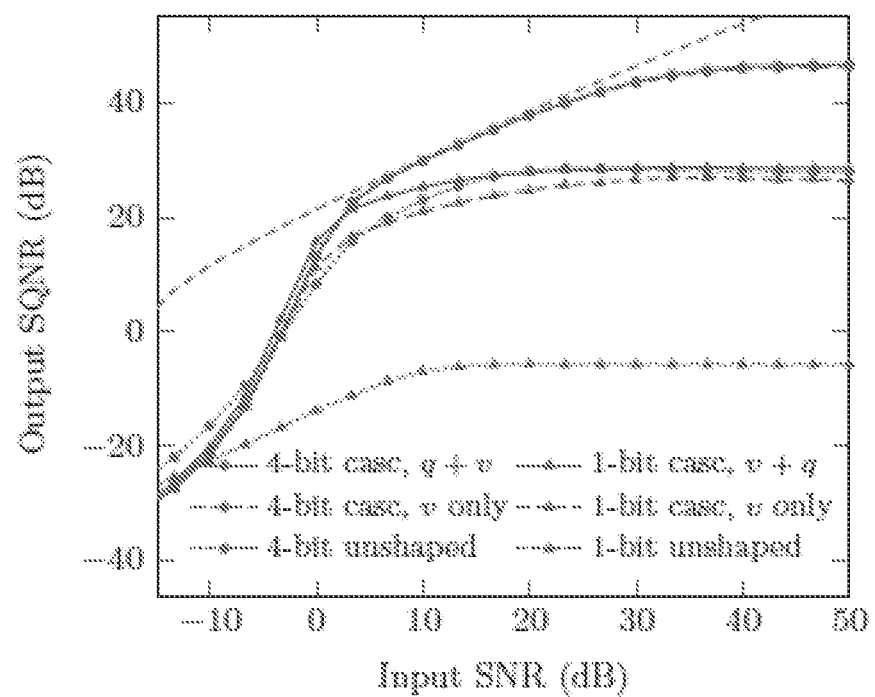
FIG. 12 shows plots of simulated output SQNR as a function of input SNR for a two hundred-element uniform linear array in accordance with an embodiment of the present invention.

FIG. 12 compares the output signal-to-quantization-error-plus-noise ratio (SQNR) for several combinations of system parameters: one-bit and four-bit quantization; cascade error shaping and no error shaping; and a beamformer designed for the combined noise and quantization error statistics and one designed for the unquantized input signal. The results show that, in the quantization-error-limited regime at high signal-to-noise ratios (SNR), error shaping improves the output SQNR by about 30 dB for the one-bit system and 15 dB for the four-bit system. The one-bit beamformer that accounts for quantization error in its statistical model performs up to about 5 dB better than the beamformer that does not. This advantage is most pronounced at moderate input SNR, where the shaped quantization error power and the noise power are comparable but have different frequency-wavenumber distributions.

CONCLUSIONS

Embodiments of the present invention show that time-domain error shaping can indeed be translated to array processing. However, several complications arise. In array processing, space and time are not independent dimensions. Propagating waves are restricted to occupy a triangular or trapezoidal region of frequency-wavenumber space, as was discussed with reference to FIGS. 4A-4D, meaning that the spatial oversampling ratio is not fixed as a function of frequency. Furthermore, a realizable circuit for spatial error shaping incorporates time delays. Thus, every spatial error-shaping structure also performs temporal error shaping. Finally, the empirical study of error correlations above suggests that joint space-time error shaping is more effective than spatial error shaping alone at producing noiselike error sequences with few spatial correlations.

An array with low-precision quantizers preferably employs feedback in both space and time. The choice of spatial and temporal oversampling ratios depends on the application. If delay is an important consideration for the application, the input should be temporally oversampled so that sample-and-hold delays do not adversely affect the error transfer function. If delay is not a concern, then the designer can compensate for these delays using the method of FIG. 8A, for example. The error-shaping structure can be designed using the infinite-length linear shift-invariant (LSI) model as if it were a discrete-time filter. The finite-length array, which is not space-invariant, can be analyzed using the frequency-domain vector model discussed above.

Finally, beamformers or other spatial processing methods can be designed using the frequency-domain model to account for the shaped quantization error statistics at the output. Such a system can exploit error shaping in both time and space to achieve better performance than either spatial or temporal error shaping alone.

The present invention may be embodied in any number of instrument modalities. In alternative embodiments, the disclosed methods may be implemented as a computer program product for use with a computer system. Such implementations may include a series of computer instructions fixed, in a non-transitory way, either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).These and other variations and modifications are within the scope of the present invention as defined in any appended claims.

The embodiments of the invention described above are intended to be merely exemplary; numerous variations and modifications will be apparent to those skilled in the art. All such variations and modifications are intended to be within the scope of the present invention as defined in any appended claims.

We claim:

1. A space-time error-shaping array system comprising:
   a. an array of sensors, characterized by a spatial configuration, each sensor of the array producing a temporal signal comprising quantized waveforms;
   b. a multi-input multiple-output (MIMO) discrete-time filter structure having a plurality of inputs and a plurality of outputs, each input coupled to a sensor of the array of sensors, for shaping quantization errors of the array of sensors on the basis of temporal aspects of the temporal signals conjointly with spatial aspects of the quantized waveforms; and
   c. a digital multichannel processor for receiving output signals derived from the plurality of outputs of the MIMO discrete-time filter structure, and for processing the output signals using a statistical model of shaped quantization errors associated with the quantized waveforms.

2. The space-time error-shaping array system of claim 1, additionally comprising a dimensionality-reduction filter coupled to the plurality of outputs of the MIMO discrete-time filter structure, the dimensionality-reduction filter having a plurality of output signals.

3. The space-time error-shaping array system of claim 1, wherein there is no constraint on the spatial configuration of the array of sensors.

4. The space-time error-shaping array system of claim 1, wherein the spatial configuration of the array of sensors is periodically constrained.

5. The space-time error-shaping array system of claim 1, wherein the digital multichannel processor includes a beamformer.

6. The space-time error-shaping array system of claim 5, wherein the beamformer includes a filter-and-sum beamformer.

7. A space-time error-shaping array system comprising:
   a. an array of sensors, characterized by a spatial configuration, each sensor of the array producing a temporal signal comprising quantized waveforms;
   b. a set of mixers for receiving at least one of the temporal signals of quantized waveforms and generating, at a mixer output, bandlimited intermediate frequency (IF) signals;
   c. a MIMO discrete-time filter structure having a plurality of inputs and a plurality of outputs, each input coupled to receive a mixer output, for shaping quantization errors of the array of sensors on the basis of at least one of temporal and spatial aspects of the IF signals; and
   d. a digital multichannel processor for receiving output signals derived from the plurality of outputs for the MIMO discrete-time filter structure, and for processing the output signals using a statistical model of shaped quantization errors associated with the quantized waveforms.

8. The space-time error-shaping array system of claim 3, additionally comprising a dimensionality-reduction filter coupled to the plurality of outputs of the MIMO discrete-time filter structure, the dimensionality-reduction filter having a plurality of output signals.

9. The space-time error-shaping array system of claim 7, wherein there is no constraint on the spatial configuration of the array of sensors.

10. The space-time error-shaping array system of claim 7, wherein the spatial configuration of the array of sensors is periodically constrained.

11. The space-time error-shaping array system of claim 7, wherein the digital multichannel processor includes a beamformer.

12. A space-time error-shaping array system comprising:
    a. an array of sensors, characterized by a spatial configuration, each sensor of the array producing a temporal signal comprising quantized waveforms; and
    b. a multi-input multiple-output (MIMO) discrete-time filter structure having a plurality of inputs and a plurality of outputs, each input coupled to a sensor of the array of sensors, for shaping quantization errors of the array of sensors on the basis of temporal aspects of the temporal signals conjointly with spatial aspects of the quantized waveforms;
    wherein the quantized waveforms include coarsely quantized waveforms.

13. A method for processing signals derived from a plurality of sensors together constituting an array of sensors, characterized by a spatial configuration, the method comprising:
    a. quantizing the signals derived from each of the plurality of sensors to form a temporal signal comprising quantized waveforms; and
    b. in a MIMO discrete-time filter structure, shaping quantization errors in each of the quantized waveforms using feedback on the basis of temporal aspects of the quantized waveforms conjointly with spatial aspects of the quantized waveforms,
    wherein the quantized waveforms include coarsely quantized waveforms.

14. The method of claim 13, further comprising receiving at least one of the quantized waveforms and generating, at a mixer output, bandlimited intermediate frequency (IF) signals.

15. The method of claim 13, further comprising reducing the dimensionality of a plurality of outputs of the MIMO discrete-time filter structure.

16. The method of claim 13, wherein there is no constraint on the spatial configuration of the array of sensors.

17. The method of claim 13, wherein the spatial configuration of the array of sensors is periodically constrained.

18. A space-time error-shaping array system comprising:
    a. an array of sensors, characterized by a spatial configuration, each sensor of the array producing a temporal signal comprising quantized waveforms;
    b. a set of mixers for receiving at least one of the temporal signals of quantized waveforms and generating, at a mixer output, bandlimited intermediate frequency (IF) signals; and
    c. a MIMO discrete-time filter structure having a plurality of inputs and a plurality of outputs, each input coupled to receive a mixer output, for shaping quantization errors of the array of sensors on the basis of at least one of temporal and spatial aspects of the IF signals,
    wherein the quantized waveforms include coarsely quantized waveforms.

* * * * *